US011921332B2

(12) United States Patent
Morioka et al.

(10) Patent No.: US 11,921,332 B2
(45) Date of Patent: Mar. 5, 2024

(54) OPTICAL RECEPTACLE AND OPTICAL MODULE

(71) Applicant: Enplas Corporation, Kawaguchi (JP)

(72) Inventors: Shimpei Morioka, Saitama (JP); Hiroyoshi Kani, Saitama (JP)

(73) Assignee: Enplas Corporation, Saitama (JP)

( * ) Notice: Subject to any disclaimer, the term of this patent is extended or adjusted under 35 U.S.C. 154(b) by 339 days.

(21) Appl. No.: 17/424,907

(22) PCT Filed: Jan. 23, 2020

(86) PCT No.: PCT/JP2020/002327
§ 371 (c)(1),
(2) Date: Jul. 22, 2021

(87) PCT Pub. No.: WO2020/153427
PCT Pub. Date: Jul. 30, 2020

(65) Prior Publication Data
US 2022/0107471 A1    Apr. 7, 2022

(30) Foreign Application Priority Data
Jan. 24, 2019   (JP) ................................ 2019-010190

(51) Int. Cl.
  *G02B 6/42*   (2006.01)
  *H01S 5/0239* (2021.01)
  *H01S 5/183*  (2006.01)

(52) U.S. Cl.
  CPC .......... *G02B 6/4206* (2013.01); *H01S 5/0239* (2021.01); *H01S 5/183* (2013.01); *G02B 6/425* (2013.01)

(58) Field of Classification Search
  CPC .............................. G02B 6/425; H01S 5/0239
  See application file for complete search history.

(56) References Cited

U.S. PATENT DOCUMENTS 6,457,875 B1    10/2002 Kropp et al.
2004/0062479 A1*  4/2004 Capewell ............ G02B 6/4214
                                                385/36
(Continued)

FOREIGN PATENT DOCUMENTS

JP    2006-227043    8/2006
JP    2008-015224    1/2008
(Continued)

OTHER PUBLICATIONS

International Search Report and Written Opinion for International Application No. PCT/JP2020/002327 dated Mar. 24, 2020, 10 pages.

*Primary Examiner* — Sung H Pak
(74) *Attorney, Agent, or Firm* — Amin, Turocy & Watson, LLP

(57) ABSTRACT

The optical receptacle, which is disposed between one or more vertical resonator surface emitting lasers arranged on a substrate and one or more optical transmission bodies to optically couple the vertical resonator surface emitting lasers and end surfaces of the optical transmission bodies, has: a first optical surface on which light emitted from the vertical resonator surface emitting lasers is incident; and a second optical surface for emitting light, which enters the first optical surface and passes through the inside thereof, toward the end surfaces of the optical transmission bodies. The first optical surface is disposed such that a central axis of the first optical surface is inclined with respect to an optical axis of the vertical resonator surface emitting laser or the central axis and the optical axis are parallel to and do not coincide with each other.

13 Claims, 5 Drawing Sheets

(56) References Cited

U.S. PATENT DOCUMENTS

| | | | |
|---|---|---|---|
| 2006/0182442 | A1 | 8/2006 | Nagasaka |
| 2014/0133802 | A1 | 5/2014 | Morioka |
| 2019/0033528 | A1 | 1/2019 | Dotorii |
| 2019/0317284 | A1 | 10/2019 | Matsuoka et al. |

FOREIGN PATENT DOCUMENTS

| | | |
|---|---|---|
| JP | 2013-024918 | 2/2013 |
| JP | 2017-134282 | 8/2017 |
| JP | 2018-124392 | 8/2018 |
| JP | 2019-184941 | 10/2019 |

\* cited by examiner

OPTICAL RECEPTACLE AND OPTICAL MODULE

TECHNICAL FIELD

The present invention relates to an optical receptacle and an optical module.

BACKGROUND ART

In the related art, in optical communications using optical transmission members such as optical fibers and light waveguides, an optical module including a light-emitting element such as a vertical cavity surface emitting laser (VCSEL) is used. The optical module includes an optical receptacle that causes light including communication information emitted from the light-emitting element to enter an end surface of an optical transmission member (see, for example, PTL 1).

PTL 1 discloses an optical module including a photoelectric conversion device including a light-emitting element, and an optical receptacle that optically connects the light-emitting element and an end surface of an optical transmission member. The optical receptacle includes a first surface that allows incidence of light emitted from light-emitting element, a reflection surface that reflects, toward the end surface of optical transmission member, light entered from the first surface, and a second surface that emits signal light reflected by the reflection surface such that the light is focused to the end surface of the optical transmission member.

In the optical module disclosed in PTL 1, light emitted from the light-emitting element is entered from the first surface. The light entered from the first surface is reflected by the reflection surface. The light reflected by the reflection surface is transmitted through the transmission part as signal light, and emitted from the second surface toward the end surface of the optical transmission member. The light emitted from the second surface reaches the end surface of optical transmission member.

CITATION LIST

Patent Literature

PTL 1
Japanese Patent Application Laid-Open No. 2013-24918

SUMMARY OF INVENTION

Technical Problem

However, in the optical module disclosed in PTL 1, a part of the light reaching the end surface of optical transmission member is reflected by the end surface of the optical transmission member to re-enter the optical receptacle from the second surface, such that the light is again reflected by the reflection surface and then emitted from the first surface. The light emitted from the first surface reaches the light-receiving surface of the light-emitting element. If the return light reaches the light-receiving surface of the light-emitting element, the intensity distribution of the light emitted from the light-emitting element may be disturbed.

An object of the present invention is to provide an optical receptacle and an optical module that can reduce the returning light to the vertical cavity surface emitting laser while maintaining the light coupling efficiency to the optical transmission member.

Solution to Problem

An optical receptacle according to an embodiment of the present invention is configured to be disposed between one or more vertical cavity surface emitting lasers disposed on a substrate and one or more optical transmission members, the optical receptacle being configured to optically couple the one or more vertical cavity surface emitting lasers and an end surface of the one or more optical transmission members, the optical receptacle including: a first optical surface configured to allow incidence of light emitted from the one or more vertical cavity surface emitting lasers; and a second optical surface configured to emit, toward the end surface of the one or more optical transmission members, light entered from the first optical surface and transmitted inside, wherein the first optical surface is disposed such that a central axis of the first optical surface is tilted with respect to an optical axis of the one or more vertical cavity surface emitting lasers, or that the central axis and the optical axis are in parallel without coinciding with each other.

An optical module according to an embodiment of the present invention includes a photoelectric conversion device including a substrate and a vertical cavity surface emitting laser disposed on the substrate; and the above-described optical receptacle.

Advantageous Effects of Invention

According to the present invention, it is possible to provide an optical receptacle and an optical module that can reduce the returning light to the vertical cavity surface emitting laser while maintaining the light coupling efficiency to the optical transmission member.

DESCRIPTION OF EMBODIMENTS

Embodiments according to the present invention are elaborated below with reference to the accompanying drawings.

Embodiment 1

Configuration of Optical Module

Figure 1A:
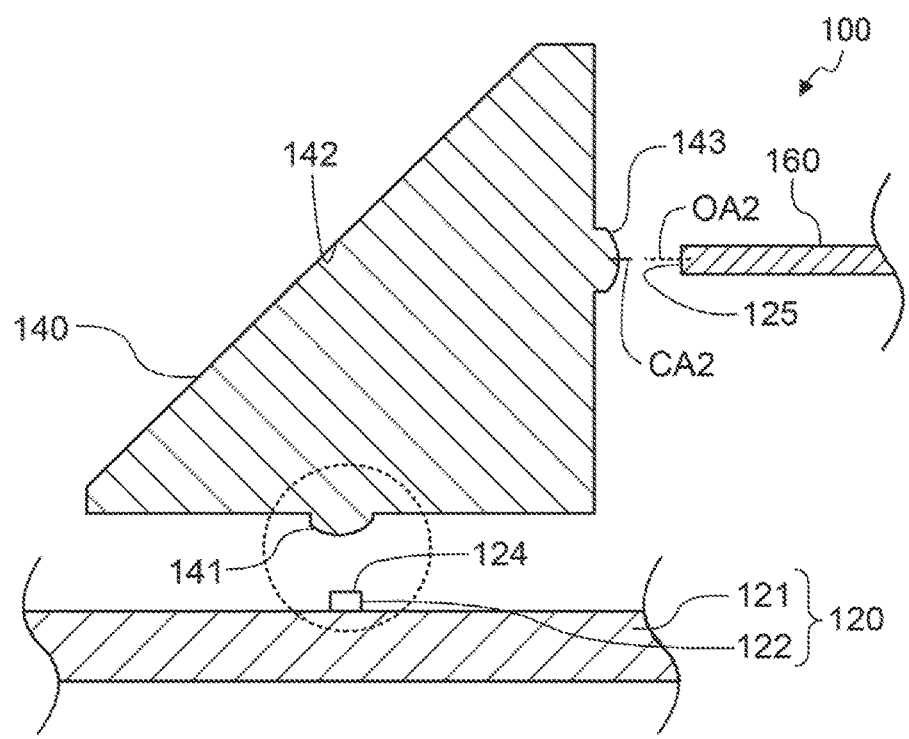
FIGS. 1A and 1B illustrate a configuration of an optical module according to Embodiment 1.
Figure 1B:
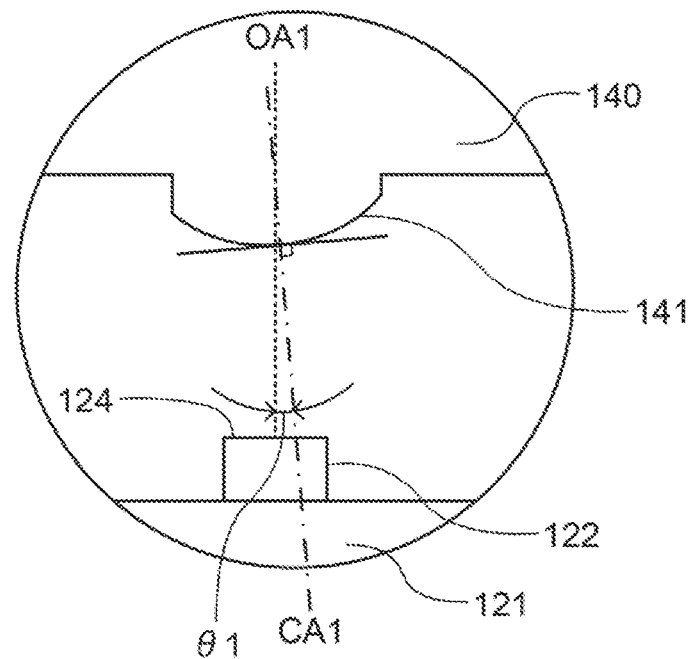

FIGS. 1A and 1B illustrate a configuration of an optical module according to Embodiment 1. FIG. 1A is a sectional view of optical module 100 according to Embodiment 1, and FIG. 1B is a partially enlarged sectional view of the region indicated by the broken line illustrated in FIG. 1A. Note that hatching is omitted in FIG. 1B.

As illustrated in FIGS. 1A and 1B, optical module 100 includes photoelectric conversion device 120 of a substrate mounted type including vertical cavity surface emitting laser (VCSEL) 122 serving as a light-emitting element, and optical receptacle 140. Optical module 100 is an optical module for light transmission, and is used with optical transmission member 160 coupled (hereinafter referred to as "connected") to optical receptacle 140 through a ferrule. The type of optical transmission member 160 is not limited, and optical transmission member 160 may be an optical fiber, a light waveguide or the like. In the present embodiment, optical transmission member 160 is an optical fiber. The optical fiber may be of a single mode type, or a multiple mode type. The number of optical transmission members 160 is one or more. In the present embodiment, one optical transmission member 160 is provided.

Photoelectric conversion device 120 includes substrate 121, and vertical cavity surface emitting laser 122.

Substrate 121 is, for example, a glass composite substrate, a glass epoxy substrate, or a flexible substrate. Vertical cavity surface emitting laser 122 is disposed on substrate 121.

Vertical cavity surface emitting laser 122, which is disposed on substrate 121, emits laser light in a direction perpendicular to substrate 121. The number of vertical cavity surface emitting lasers 122 is one or more. In the present embodiment, one vertical cavity surface emitting laser 122 is provided. In addition, the position of vertical cavity surface emitting laser 122 is not limited.

Optical receptacle 140 is disposed on substrate 121 of photoelectric conversion device 120. In the case where optical receptacle 140 is disposed between photoelectric conversion device 120 and optical transmission member 160, optical receptacle 140 optically couples light-emitting surface 124 of vertical cavity surface emitting laser 122 and end surface 125 of optical transmission member 160. A configuration of optical receptacle 140 is elaborated below.

Configuration of Optical Receptacle

Optical receptacle 140 is optically transparent, and emits, toward end surface 125 of optical transmission member 160, light emitted from light-emitting surface 124 of vertical cavity surface emitting laser 122. Optical receptacle 140 includes first optical surface 141 and second optical surface 143. Note that optical receptacle 140 according to the present embodiment includes reflection surface 142 in addition to the above-mentioned configuration.

Optical receptacle 140 is formed using a material having a transparency to light of the wavelength used in optical communications. Examples of such a material include transparent resins such as polyetherimide (PEI) and cyclic olefin resin. In addition, for example, optical receptacle 140 is manufactured by injection molding.

First optical surface 141 is an optical surface for entering, into optical receptacle 140, light emitted from vertical cavity surface emitting laser 122 while refracting the light. First optical surface 141 can convert the light emitted from vertical cavity surface emitting laser 122 into collimated light, converged light, or diffused light. In the present embodiment, first optical surface 141 converts the light emitted from vertical cavity surface emitting laser 122 into collimated light in such a manner as to narrow the light flux. As described later, the narrowed light flux is totally reflected by reflection surface 142 toward second optical surface 143. In the present embodiment, the shape of first optical surface 141 is a convex lens surface protruding toward vertical cavity surface emitting laser 122. In addition, first optical surface 141 has a circular shape in plan view. As described later, from the viewpoint of reducing returning light to vertical cavity surface emitting laser 122, central axis CA1 of first optical surface 141 is tilted with respect to optical axis OA1 of vertical cavity surface emitting laser 122.

Inclination angle $\theta 1$ of central axis CA1 of first optical surface 141 with respect to optical axis OA1 of vertical cavity surface emitting laser 122 is not limited as long as the returning light to vertical cavity surface emitting laser 122 can be reduced. From the viewpoint of reducing the returning light to vertical cavity surface emitting laser 122, inclination angle $\theta 1$ is preferably 0.1 to 23°, more preferably 3 to 7°.

Reflection surface 142 is an inclined surface formed on the top surface side of optical receptacle 140, and is disposed on the light path between first optical surface 141 and second optical surface 143. Reflection surface 142 reflects, toward second optical surface 143, light entered from first optical surface 141 (the light emitted from vertical cavity surface emitting laser 122). Reflection surface 142 may be a flat surface or a curved surface. In the present embodiment, reflection surface 142 is a flat surface. Reflection surface 142 is tilted such that the distance to optical transmission member 160 decreases in the direction from the bottom surface toward the top surface of optical receptacle 140. In the present embodiment, the inclination angle of reflection surface 142 is 45° with respect to the optical axis of the light entered from first optical surface 141. The light entered from first optical surface 141 internally impinges on reflection surface 142 at an incident angle greater than a critical angle. In this manner, reflection surface 142 totally reflects incident light in the direction along the surface of substrate 121.

Second optical surface 143 is an optical surface that emits, toward end surface 125 of optical transmission member 160, the light reflected by reflection surface 142. In the present embodiment, second optical surface 143 is disposed to face end surface 125 of optical transmission member 160, on the front side of optical receptacle 140. The shape of second optical surface 143 is a convex lens surface protruding toward end surface 125 of optical transmission member 160. In the present embodiment, central axis CA2 of second optical surface 143 coincides with optical axis OA2 of end surface 125 of optical transmission member 160. In this manner, the light entered from first optical surface 141 and reflected by reflection surface 142 can be focused and efficiently entered into end surface 125 of optical transmission member 160.

The light emitted from vertical cavity surface emitting laser 122 enters optical receptacle 140 from first optical surface 141. The light having entered optical receptacle 140 is internally reflected by reflection surface 142 toward second optical surface 143. The light having reached second optical surface 143 is emitted while being focused toward end surface 125 of optical transmission member 160. Then, while most of the light having reached end surface 125 of optical transmission member 160 enters optical transmission member 160 from end surface 125 of optical transmission member 160, a part of the light is reflected by end surface 125 of optical transmission member 160. The light reflected by the end surface of optical transmission member 160 travels toward photoelectric conversion device 120 through second optical surface 143 and reflection surface 142. It should be noted that, in optical receptacle 140 according to the present embodiment, central axis CA1 of first optical surface 141 is tilted with respect to optical axis OA1 of vertical cavity surface emitting laser 122, and thus only a part of the reflection light becomes return light that reaches light-emitting surface 124 of vertical cavity surface emitting laser 122 after being emitted from first optical surface 141, whereas most of the reflection light reaches the region other than vertical cavity surface emitting laser 122 of photoelectric conversion device 120 after being emitted from the region other than first optical surface 141.

Simulations

Figure 2:
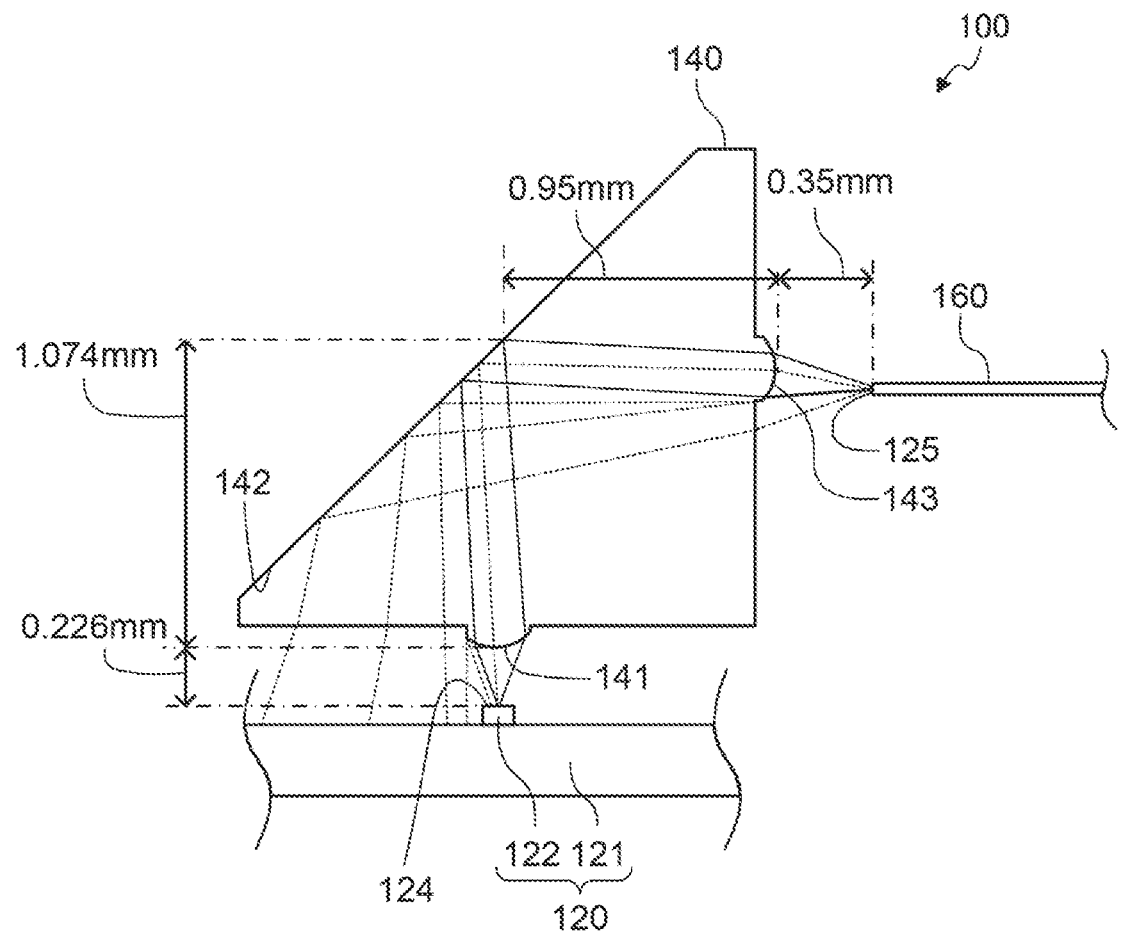
FIG. 2 is a drawing illustrating a positional relationship of each component of an optical module in a simulation.

Here, the relationship between inclination angle θ1 of central axis CA1 of first optical surface 141 with respect to optical axis OA1 of vertical cavity surface emitting laser 122, the light coupling efficiency at end surface 125 of optical transmission member 160 of the light (signal light) emitted from vertical cavity surface emitting laser 122, and the return light was examined FIG. 2 illustrates a positional relationship between vertical cavity surface emitting laser 122, optical receptacle 140, and optical transmission member 160. Note that in FIG. 2, hatching is omitted. The thin solid line of FIG. 2 indicates a light path of signal light, and the broken line indicates a light path of return light.

Light-emitting surface 124 of vertical cavity surface emitting laser 122 has diameter φ of 10 μm and a numerical aperture (NA) of 0.3. End surface (light-receiving surface) 125 of optical transmission member 160 has diameter φ of 50 μm, and the numerical aperture (NA) is not taken into consideration. In addition, the reflectance of end surface 125 of optical transmission member 160 was set to 4.0%. Each of diameter φ of first optical surface 141 and diameter φ of second optical surface 143 was set to 0.25 mm. In this simulation, optical receptacle 140 is formed of a material that forms an interface at which, when the light emitted from vertical cavity surface emitting laser 122 perpendicularly impinges on first optical surface 141, 5.6% of the light is surface reflected. This simulation assumes that in optical receptacle 140, the quantity of the light corresponding to 5.6% is reflected and lost when the light emitted from vertical cavity surface emitting laser 122 impinges on first optical surface 141. It is also assumed that when the internally advanced light is emitted from second optical surface 143, the quantity of the light corresponding to 5.6% is lost due to internal surface reflection. In this case, when the quantity of the light emitted from vertical cavity surface emitting laser 122 is set as 100%, the quantity of the light corresponding to up to approximately 88% reaches end surface (light-receiving surface) 125 of optical transmission member 160. It is estimated that in this optical receptacle 140, when the quantity of the light emitted from vertical cavity surface emitting laser 122 is set as 100%, the quantity of the return light corresponding to up to 2.11% from end surface 125 of optical transmission member 160 reaches light-emitting surface 124 of vertical cavity surface emitting laser 122.

As described above, in the present embodiment, central axis CA1 of first optical surface 141 is tilted with respect to optical axis OA1 of vertical cavity surface emitting laser 122. In this simulation, central axis CA1 of first optical surface 141 is tilted by 5° with respect to optical axis OA1 of vertical cavity surface emitting laser 122, and the quantity of approximately 88% of the light that reaches end surface 125 of optical transmission member 160 in the above-described simulation can be maintained, and, the returning light to light-emitting surface 124 of vertical cavity surface emitting laser 122 can be suppressed to a value lower than 2.11%. In the case where inclination angle θ1 of central axis CA1 of first optical surface 141 with respect to optical axis OA1 of vertical cavity surface emitting laser 122 is smaller than 0.1°, the quantity of the light corresponding to more than 0.5% is generated as return light when the quantity of the light emitted from vertical cavity surface emitting laser 122 is set as 100%. On the other hand, in the case where inclination angle θ1 of central axis CA1 of first optical surface 141 with respect to optical axis OA1 of vertical cavity surface emitting laser 122 is greater than 23°, the quantity of light corresponding to smaller than approximately 88% reaches end surface 125 of optical transmission member 160.

Now a difference between a case where only central axis CA1 of first optical surface 141 is tilted and a case where only central axis CA2 of second optical surface 143 is tilted is described. When return light impinges on vertical cavity surface emitting laser 122, the intensity distribution of the light emitted from vertical cavity surface emitting laser 122 is distorted. In the present embodiment, by reducing such return light, the performance of optical module 100 is maintained.

Here, the following discusses a light path (first light path) of the light emitted from vertical cavity surface emitting laser 122 of a case where neither of first optical surface 141 nor second optical surface 143 is tilted, a light path (second light path) of the light emitted from vertical cavity surface emitting laser 122 of a case where only first optical surface 141 is tilted, and a light path (third light path) of the light emitted from vertical cavity surface emitting laser 122 of a case where only second optical surface 143 is tilted. Note that inclination angle θ1 of first optical surface 141 and inclination angle θ2 of second optical surface 143 are identical to each other.

After passing through first optical surface 141, the light travelling on the second light path is gradually shifted from the first light path. This phenomenon becomes more significant as inclination angle θ1 of central axis CA1 of first optical surface 141 with respect to optical axis OA1 of vertical cavity surface emitting laser 122 increases.

In addition, after passing through second optical surface 143, the light travelling on the third light path is gradually shifted from the first light path as it travels. This phenomenon becomes more significant as inclination angle θ2 of central axis CA2 of second optical surface 143 with respect to optical axis OA2 of the light that is entered from first optical surface 141 and reaches second optical surface 143 increases.

The arrival position on photoelectric conversion device 120 of the return light having travelled on the second light path is different from the arrival position (light-emitting surface 124 of vertical cavity surface emitting laser 122) on photoelectric conversion device 120 of the return light having travelled on the first light path. In addition, the arrival position on photoelectric conversion device 120 of the return light having travelled on the third light path is different from the arrival position (light-emitting surface 124 of vertical cavity surface emitting laser 122) on photoelectric conversion device 120 of the return light having travelled on first light path. Here, the arrival position of the return light having travelled on the second light path is separated from light-emitting surface (the arrival position of the return light having travelled on the first light path) 124 of vertical cavity surface emitting laser 122 than the arrival position of the return light having travelled on the third light path. The reason for this is that the length of the light path shifted from the first light path is longer in the second light path than in the third light path.

Thus, in the case where inclination angle θ1 of first optical surface 141 and inclination angle θ2 of second optical surface 143 are identical to each other, the arrival position of the return light travelling on the second light path is more separated from the light-emitting surface of vertical cavity surface emitting laser 122 relative to the light travelling on the third light path. That is, the ratio of the return light that reaches vertical cavity surface emitting laser 122 can be more reduced by tilting first optical surface 141 than by tilting second optical surface 143.

Modifications

Next, optical module 200 according to a modification of Embodiment 1 is described. Optical module 200 according to the modification is different from optical module 100 according to Embodiment 1 only in the configuration of first optical surface 241. In view of this, the components similar to those of optical module 100 according to Embodiment 1 are denoted with the same reference numerals and the description thereof is omitted.

Configurations of Optical Module and Optical Receptacle

Figure 3A:
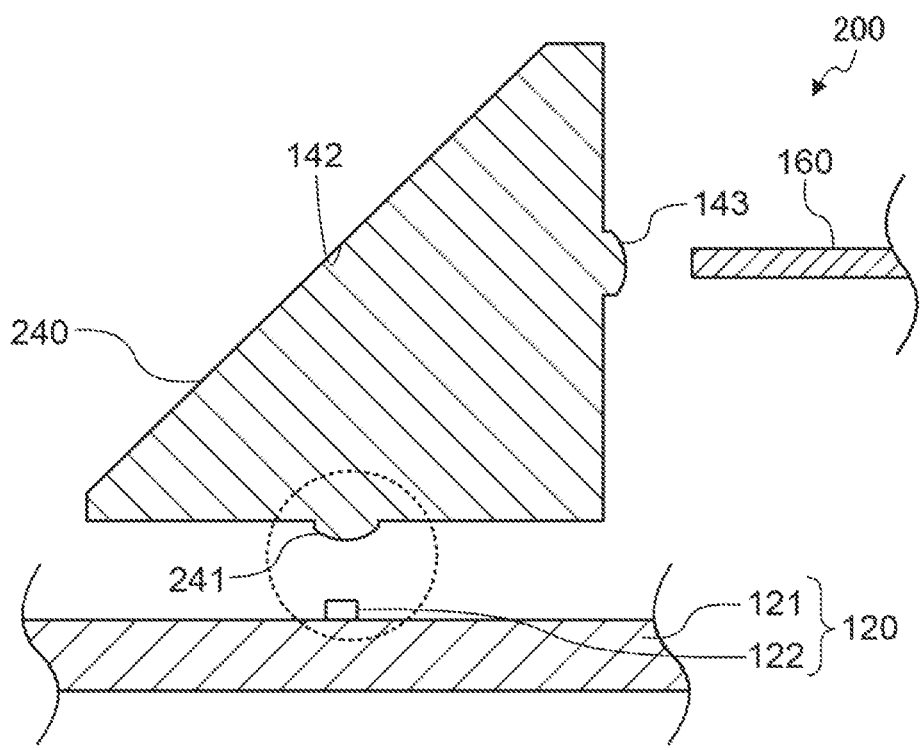
FIGS. 3A and 3B are drawings illustrating a configuration of an optical module according to a modification of Embodiment 1.
Figure 3B:
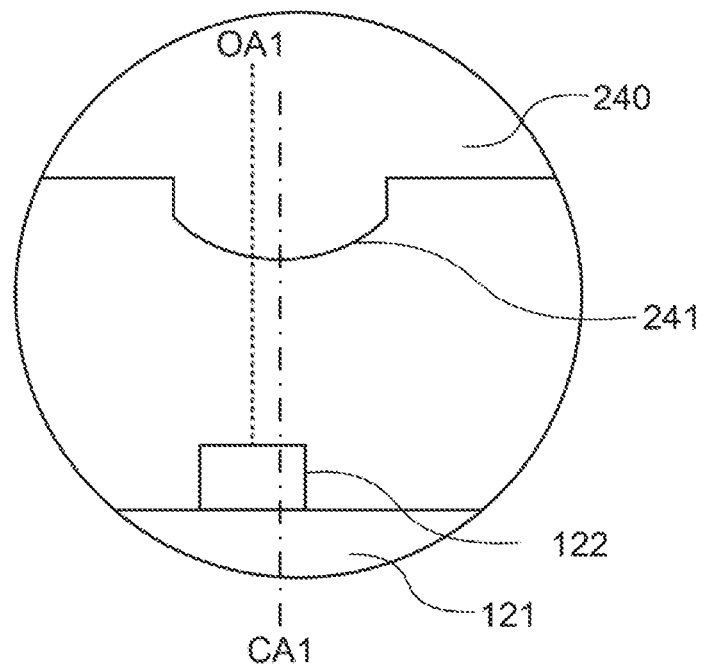

FIGS. 3A and 3B are diagrams for describing a configuration of optical module 200 according to the modification of Embodiment 1. FIG. 3A is a sectional view of optical module 200 according to the modification of Embodiment 1, and FIG. 3B is a partially enlarged sectional view of a region indicated by the broken line in FIG. 3A.

As illustrated in FIGS. 3A and 3B, optical module 200 according to the modification of Embodiment 1 includes photoelectric conversion device 120 and optical receptacle 240. Optical receptacle 240 includes first optical surface 241, reflection surface 142, and second optical surface 143.

First optical surface 241 in the modification of Embodiment 1 is a convex lens surface that converts, into collimated light, the light flux emitted from vertical cavity surface emitting laser 122 by controlling the light so as to narrow the light flux. In addition, first optical surface 241 has a circular shape in plan view. First optical surface 241 is disposed such that its central axis CA1 is parallel to optical axis OA1 of vertical cavity surface emitting laser 122. In addition, first optical surface 241 is disposed such that its central axis CA1 does not coincide with optical axis OA1 of the light emitted from vertical cavity surface emitting laser 122.

Optical module 200 according to the modification of the present embodiment can also reduce the ratio of the return light that reaches vertical cavity surface emitting laser 122.

Effect

As described above, in optical modules 100 and 200 of the embodiment of the present invention, first optical surfaces 141 and 241 are disposed such that central axis CA1 is tilted with respect to optical axis OA1 of vertical cavity surface emitting laser 122, or that central axis CA2 and optical axis OA2 are in parallel without coinciding with each other. In this manner, a part of return light does not reach light-emitting surface 124 of vertical cavity surface emitting laser 122, and thus it is possible to reduce the ratio of the return light that reaches vertical cavity surface emitting laser 122 while maintaining the light coupling efficiency, to optical transmission member 160, of the light emitted from vertical cavity surface emitting laser 122.

Embodiment 2

Next, optical module 300 according to Embodiment 2 of the present invention is described. Optical module 300 according to Embodiment 2 is different from optical module 100 according to Embodiment 1 only in the configuration of second optical surface 343. In view of this, the components similar to those of optical module 100 according to Embodiment 1 are denoted with the same reference numerals and the description thereof is omitted.

Configurations of Optical Module and Optical Receptacle

Figure 4A:
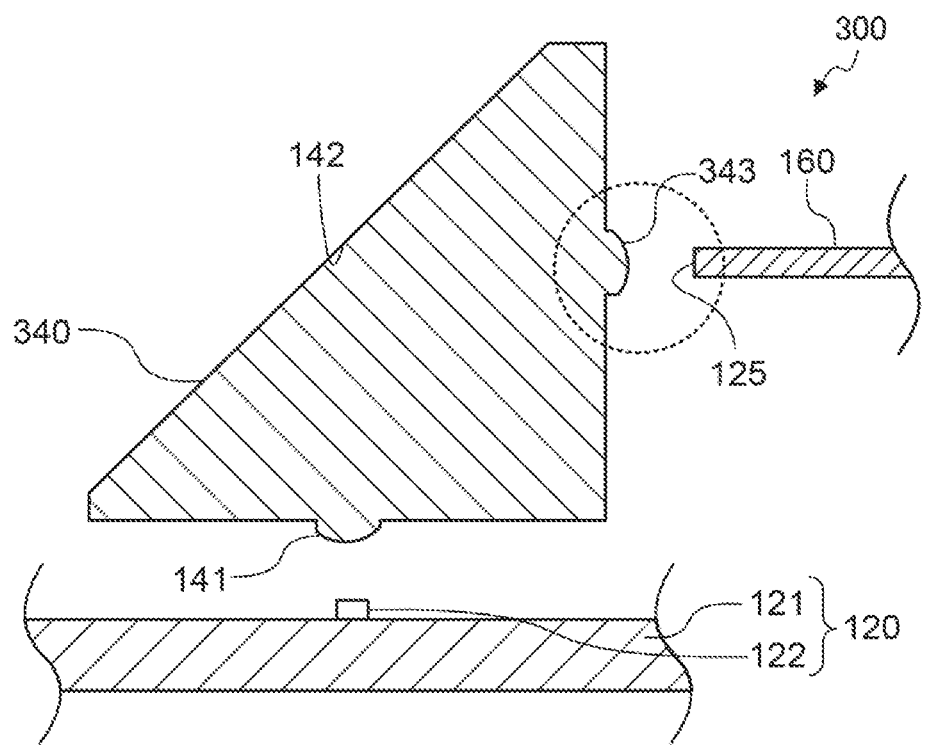
FIGS. 4A and 4B are drawings illustrating a configuration of an optical module according to Embodiment 2.
Figure 4B:
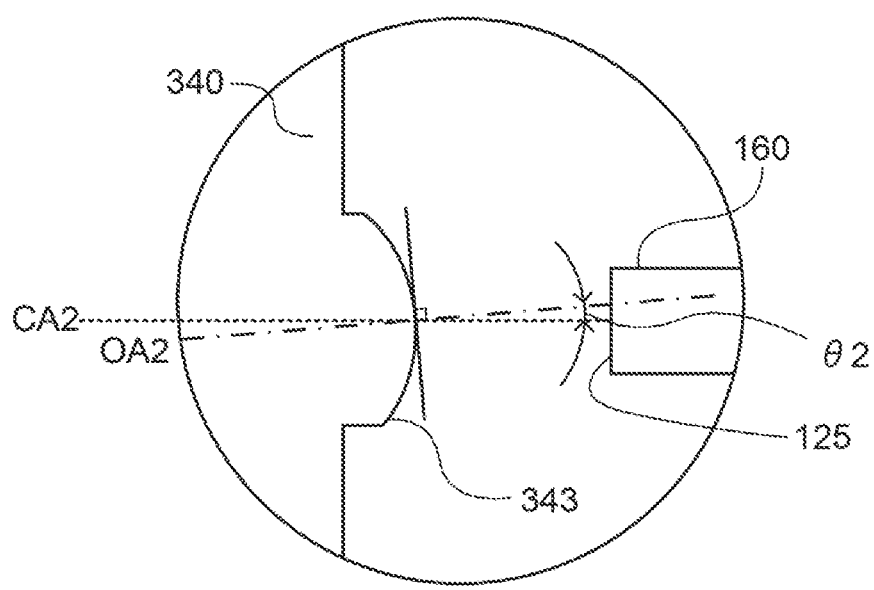

FIGS. 4A and 4B are diagrams for describing a configuration of optical module 300 according to Embodiment 2. FIG. 4A is a sectional view of optical module 300 according to Embodiment 2, and FIG. 4B is a partially enlarged sectional view of the region indicated by the broken line in FIG. 4A.

As illustrated in FIGS. 4A and 4B, optical module 300 according to Embodiment 2 includes photoelectric conversion device 120 and optical receptacle 340. Optical receptacle 340 includes first optical surface 141, reflection surface 142 and second optical surface 343.

Second optical surface 343 in Embodiment 2 is an optical surface that emits, toward end surface 125 of optical transmission member 160, the light reflected by reflection surface 142. In the present embodiment, second optical surface 343 is disposed to face end surface 125 of optical transmission member 160, on the front side of optical receptacle 340. The shape of second optical surface 343 is a convex lens surface protruding toward end surface 125 of optical transmission member 160. In addition, second optical surface 343 has a circular shape in plan view. From the viewpoint of reducing the returning light to vertical cavity surface emitting laser 122, central axis CA2 of second optical surface 343 is tilted with respect to optical axis OA2 of light that is entered from first optical surface 141 and reaches second optical surface 343. Inclination angle θ2 of central axis CA2 of second optical surface 343 with respect to optical axis OA2 of the light that is entered from first optical surface 141 and reaches second optical surface 343 is not limited. From the viewpoint of reducing the returning light to vertical cavity surface emitting laser 122 while suppressing the loss of the quantity of light that reaches optical transmission member 160, inclination angle θ2 is preferably 0.1 to 23°, more preferably 3 to 7°.

In optical module 300 according to the present embodiment, the optical axis is shifted also when light passes through second optical surface 343, and thus the ratio of the return light that reaches vertical cavity surface emitting laser 122 can be further reduced.

Effect

As described above, in optical module 300 according to the present embodiment, the ratio of the return light that reaches vertical cavity surface emitting laser 122 can be further reduced while maintaining the light coupling efficiency, to optical transmission member 160, of the light emitted from vertical cavity surface emitting laser 122.

Embodiment 3

Next, optical module 400 according to Embodiment 3 of the present invention is described. Optical module 400 according to Embodiment 3 is different from optical module 100 according to Embodiment 1 only in the configuration of reflection surface 442. In view of this, the components similar to those of optical module 100 according to Embodiment 1 are denoted with the same reference numerals and the description thereof is omitted.

Configurations of Optical Module and Optical Receptacle

Figure 5A:
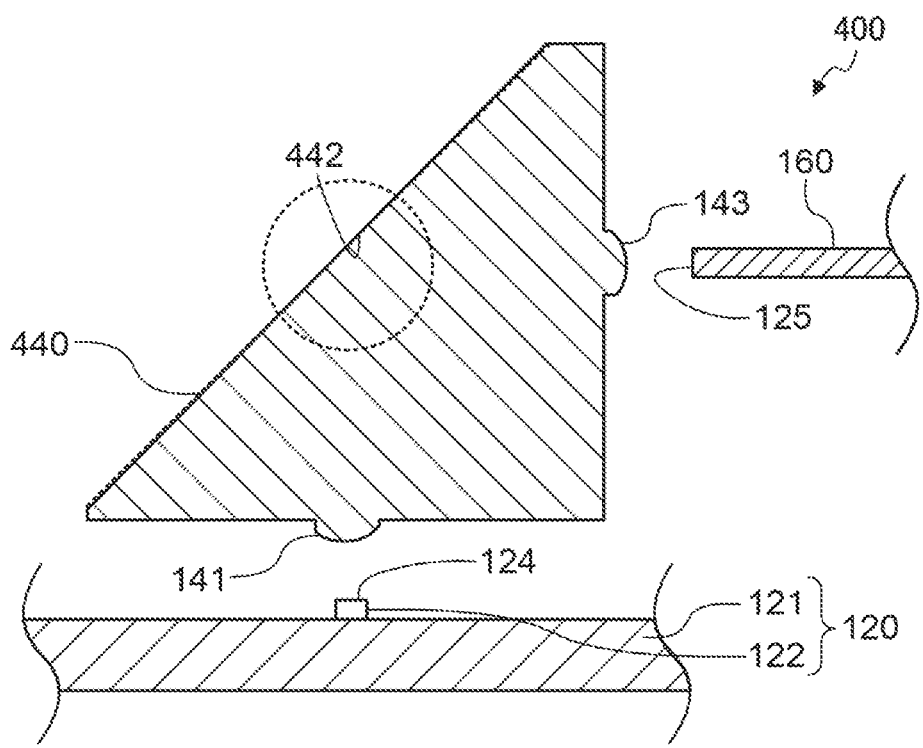
FIGS. 5A and 5B are drawings illustrating a configuration of an optical module according to Embodiment 3.
Figure 5B:
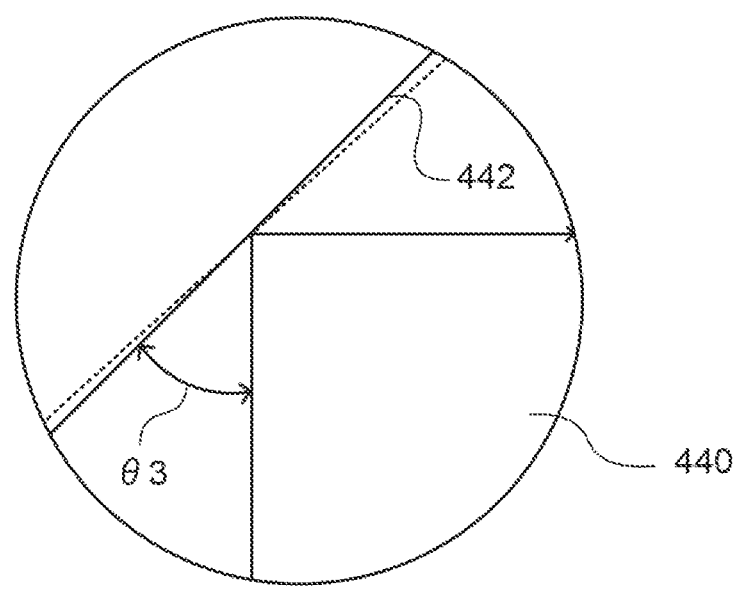

FIGS. 5A and 5B are diagrams for describing a configuration of optical module 400 according to Embodiment 3. FIG. 5A is a sectional view of optical module 400 according to Embodiment 3, and FIG. 5B is a partially enlarged sectional view of the region indicated with the broken line in FIG. 5A. The broken line illustrated in FIG. 5B indicates reflection surface 142 of Embodiments 1 and 2.

As illustrated in FIGS. 5A and 5B, optical module 400 according to Embodiment 3 includes photoelectric conversion device 120 and optical receptacle 440. Optical receptacle 440 includes first optical surface 141, reflection surface 442 and second optical surface 143.

Also in optical module 400 of Embodiment 3, reflection surface 442 reflects, toward second optical surface 143, the light entered from first optical surface 141 (the light emitted from vertical cavity surface emitting laser 122). In the present embodiment, reflection surface 442 is a flat surface. Reflection surface 442 is tilted such that the distance to optical transmission member 160 decreases in the direction from the bottom surface toward the top surface of optical receptacle 440. In optical module 400 according to Embodiment 3, inclination angle θ3 of reflection surface 442 with respect to the optical axis of the light entered from first optical surface 141 is shifted from 45° from the viewpoint of reducing the returning light to vertical cavity surface emitting laser 122. Inclination angle θ3 of reflection surface 442 with respect to the optical axis of the light entered from first optical surface 141 is not limited as long as the abovementioned function can be ensured. In the present embodiment, inclination angle θ3 of reflection surface 442 with respect to the optical axis of the light entered from first optical surface 141 is 38 to 41° or 49 to 52°. The light entered from first optical surface 141 internally impinges on reflection surface 442 at an incident angle greater than a critical angle.

In optical module 400 according to the present embodiment, the optical axis is shifted also when the light is reflected by reflection surface 442, and thus the ratio of the return light that reaches vertical cavity surface emitting laser 122 can be further reduced.

Note that in optical module 200 according to the modification of Embodiment 1 and optical module 300 according to Embodiment 2, inclination angle θ3 of reflection surface 142 with respect to the optical axis of the light entered from first optical surface 141 is 34 to 41° or 45 to 56°.

Effect

As described above, in optical module 400 according to the present embodiment, the ratio of the return light that reaches vertical cavity surface emitting laser 122 can be further reduced while maintaining the light coupling efficiency, to optical transmission member 160, of the light emitted from vertical cavity surface emitting laser 122.

This application is entitled to and claims the benefit of Japanese Patent Application No. 2019-010190 filed on Jan. 24, 2019, the disclosure each of which including the specification, drawings and abstract is incorporated herein by reference in its entirety.

INDUSTRIAL APPLICABILITY

The optical receptacle and the optical module according to the embodiments of the present invention are suitable for optical communications using an optical transmission member.

REFERENCE SIGNS LIST 100, 200, 300, 400 Optical module
120 Photoelectric conversion device
121 Substrate
122 Vertical cavity surface emitting laser
124 Light-emitting surface
125 End surface
140, 240, 340, 440 Optical receptacle
141, 241 First optical surface
142, 442 Reflection surface
143, 343 Second optical surface
160 Optical transmission member

What is claim is:

1. An optical receptacle configured to be disposed between one or more vertical cavity surface emitting lasers disposed on a substrate and one or more optical transmission members, the optical receptacle being configured to optically couple the one or more vertical cavity surface emitting lasers and an end surface of the one or more optical transmission members, the optical receptacle comprising:
a first optical surface configured to allow incidence of light emitted from the one or more vertical cavity surface emitting lasers;
a second optical surface configured to emit, toward the end surface of the one or more optical transmission members, light entered from the first optical surface and transmitted inside; and
a reflection surface configured to internally reflect, toward the second optical surface, light entered from the first optical surface,
wherein the first optical surface is disposed such that a central axis of the first optical surface is tilted with respect to an optical axis of the one or more vertical cavity surface emitting lasers, or that the central axis and the optical axis are in parallel without coinciding with each other,
wherein an inclination angle of the reflection surface with respect to an optical axis of light entered from the first optical surface is 49 to 52°.

2. The optical receptacle according to claim 1, wherein the central axis is tilted by 0.1 to 23° with respect to the optical axis.

3. The optical receptacle according to claim 1,
wherein the reflection surface is disposed such that a part of light emitted from the one or more vertical cavity surface emitting lasers and reflected by the end surface of the one or more optical transmission members after travelling through the first optical surface and the second optical surface does not reach the first optical surface.

4. The optical receptacle according to claim 1, wherein the second optical surface is disposed such that a central axis of the second optical surface is tilted with respect to an optical axis of light that is entered from the first optical surface and reaches the second optical surface.

5. The optical receptacle according to claim 4, wherein the central axis of the second optical surface is tilted by 0.1 to 23° with respect to the optical axis of the light that is entered from the first optical surface and reaches the second optical surface.

6. An optical module comprising:
a photoelectric conversion device including a substrate and a vertical cavity surface emitting laser disposed on the substrate; and
the optical receptacle according to claim 1.

7. The optical receptacle according to claim 2,
wherein the reflection surface is disposed such that a part of light emitted from the one or more vertical cavity surface emitting lasers and reflected by the end surface of the one or more optical transmission members after travelling through the first optical surface and the second optical surface does not reach the first optical surface.

8. The optical receptacle according to claim 2, wherein the second optical surface is disposed such that a central axis of the second optical surface is tilted with respect to an optical axis of light that is entered from the first optical surface and reaches the second optical surface.

9. The optical receptacle according to claim 3, wherein the second optical surface is disposed such that a central axis of the second optical surface is tilted with respect to an optical axis of light that is entered from the first optical surface and reaches the second optical surface.

10. An optical module comprising:
a photoelectric conversion device including a substrate and a vertical cavity surface emitting laser disposed on the substrate; and
the optical receptacle according to claim 2.

11. An optical module comprising:
a photoelectric conversion device including a substrate and a vertical cavity surface emitting laser disposed on the substrate; and
the optical receptacle according to claim 3.

12. An optical module comprising:
a photoelectric conversion device including a substrate and a vertical cavity surface emitting laser disposed on the substrate; and
the optical receptacle according to claim 4.

13. An optical module comprising:
a photoelectric conversion device including a substrate and a vertical cavity surface emitting laser disposed on the substrate; and
the optical receptacle according to claim 5.

* * * * *